United States Patent
Yagi

[11] Patent Number: 5,899,792
[45] Date of Patent: May 4, 1999

[54] OPTICAL POLISHING APPARATUS AND METHODS

[75] Inventor: Takeshi Yagi, Yokohama, Japan

[73] Assignee: Nikon Corporation, Japan

[21] Appl. No.: 08/985,619

[22] Filed: Dec. 5, 1997

[30] Foreign Application Priority Data

Dec. 10, 1996 [JP] Japan ..................................... 8-346713

[51] Int. Cl.$^6$ ............................ B24B 49/00; B24B 51/00
[52] U.S. Cl. .................................. 451/6; 451/287; 451/41
[58] Field of Search .................................. 451/5, 6, 9, 10, 451/11, 28, 41, 42, 285, 286, 287, 288, 289, 272, 268, 269; 438/14, 692, 8; 156/345

[56] References Cited

U.S. PATENT DOCUMENTS

| | | | |
|---|---|---|---|
| 5,433,651 | 7/1995 | Lustig et al. | 451/6 |
| 5,609,511 | 3/1997 | Moriyama et al. | 451/5 |
| 5,667,424 | 9/1997 | Pan | 451/6 |
| 5,672,091 | 9/1997 | Takahashi et al. | 451/6 |
| 5,730,642 | 3/1998 | Sandhu et al. | 451/6 |
| 5,823,853 | 10/1998 | Bartels et al. | 451/6 |

*Primary Examiner*—Timothy V. Eley
*Assistant Examiner*—Derris Holt Banks
*Attorney, Agent, or Firm*—Klarquist Sparkman Campbell Leigh & Whinston, LLP

[57] ABSTRACT

Optical polishing methods and apparatus are disclosed for polishing and planarizing surfaces of a wafer or other workpiece. A polishing apparatus according to the present invention preferably comprises a dispenser for dispensing polishing agent between a polishing body and the surface of the object to be polished. The polishing apparatus moves the polishing body and the object being polished against one another. The polishing body preferably comprises a light-permeable substance. A film-thickness measuring device for measuring the thickness of a film on the object being polished is preferably positioned on the side of the polishing body opposite of the surface of the object being polished. The film-thickness measuring device preferably measures the film thickness by using a light source to irradiate the object being polished through the polishing body. The film-thickness measuring device then uses light reflected from the film of the object being polished to determine the film's thickness.

24 Claims, 5 Drawing Sheets

OPTICAL POLISHING APPARATUS AND METHODS

FIELD OF THE INVENTION

The invention pertains to optical polishing apparatus and methods for polishing a semiconductor wafer or other workpiece, and more particularly pertains to optical polishing apparatus and methods for determining the state of polish of a wafer or workpiece during polishing.

BACKGROUND OF THE INVENTION

Circuit features in semiconductor devices such as integrated circuits have become increasingly small. The high-resolution photographic systems that project the circuit patterns necessary to form these small circuit features use short-wavelength light sources (e.g., ultraviolet light) and high-numerical aperture optics. Because the depth of focus of high-resolution photolithographic systems is small, the semiconductor wafers onto which circuit patterns are projected must be planar to a high degree of accuracy.

Semiconductor manufacturing has become increasingly complex, requiring numerous, complex process steps. During processing, the surface of the wafer does not remain planar.

A typical deviation from planarity is an abrupt discontinuity or "step" in wafer surface height. Any step in a conducting layer can cause increased resistance and decreased current-carrying capacity in the layer. A step in a conducting layer can also cause a break such that the conducting layer fails to provide any electrical connection.

A step in an insulating layer can cause the insulating layer to exhibit dielectric breakdown and a high leakage current or deterioration of pressure resistance. In addition, the height of such steps can exceed the depth of focus of photolithographic systems used to project circuit patterns. In other words, in order to increase the depth of focus to achieve higher resolution levels and to improve semiconductor reliability and yield, it has become necessary to ensure planarization of wafer surfaces in semiconductor devices before certain process steps are conducted.

With reference to FIG. 8, a conventional semiconductor polishing apparatus typically uses chemical-mechanical processing or chemical-mechanical planarization ("CMP"). The CMP apparatus is used to polish silicon wafers to a mirror surface.

The polishing apparatus of FIG. 8 comprises a polishing pad 2 mounted on a polishing wheel 1. The polishing wheel 1 rotates while a polishing slurry 6 drips from an outlet 5 of a dispenser 8. A wafer holder 3 holds a wafer 4. A pressure mechanism (not shown) applies a pressure 7, urging the wafer 4 against the polishing pad 2. The wafer holder 3 both rotates about its axis and slides across the polishing pad 2, thereby polishing the surface of the wafer 4.

While polishing the wafer it is preferable to measure the state-of-polish of the wafer 4. Various methods have been used for determining the state-of-polish of the wafer to determine when to stop the polish process. The state-of-polish of the wafer 4 at which polishing should stop is called the "endpoint." Endpoint determination methods include, for example, detecting changes in the frictional sound caused by polishing, and monitoring changes in the electrical current due to friction-induced resistance of the rotation motor as a result of changes in friction between the wafer 4 and the polishing pad 2.

Such conventional endpoint determination methods have various drawbacks, e.g., inaccuracy in the assessment of the polished state of the wafer and difficulty in accurately determining the thickness of the film or layer beneath the polished surface.

Optical methods of endpoint detection have also been used. In optical endpoint detection, slits are provided in the polishing wheel 1 and the polishing pad 2, through which a laser beam irradiates the wafer 4. A portion of the laser beam is reflected by the wafer 4; the reflected light is typically detected with an interferometer and used to assess the state-of-polish.

However, optical methods that require slits in the polishing wheel or the polishing pad increase the difficulty of the polish process and provide measurements of the state-of-polish of the wafer only at locations near the slits. For example, during a polish process the slits in the polishing pad 2 tend to migrate while the wafer 4 is rotated about its axis and moved laterally across the polishing pad. Such migration makes it difficult to detect a fixed endpoint for the thickness of the film on the wafer surface being polished and to measure the thickness of that film during the polish process.

In view of the foregoing, polishing apparatus and methods are needed to provide optical polishing that can continually determine a fixed-point film thickness on the object being polished during the polishing process. Additionally, polishing apparatus and methods are needed to provide optical polishing that does not require slits in the polishing pad or other polishing body while maintaining uniformity in film thickness following the polish process.

SUMMARY OF THE INVENTION

The present invention provides optical polishing apparatus and methods for polishing and planarizing a surface of a wafer or other workpiece. For simplicity, the object being polished is referred to as a "wafer." It should be understood that a variety of objects may be polished using the apparatus and methods of the present invention.

According to a preferred embodiment, a polishing apparatus of the present invention utilizes a polishing agent placed between a polishing body and the wafer to be polished. The apparatus moves the polishing body and the wafer against one another. The polishing body preferably comprises a light-permeable substance. A film-thickness measuring device for measuring the thickness of a film on the wafer being polished is preferably positioned opposite the surface of the wafer.

The film-thickness measuring device preferably measures the film thickness on the wafer by using a light source (preferably an infrared light source having a wavelength of about 1 $\mu$m to about 6 $\mu$m) to irradiate the wafer through the polishing body. The film-thickness measuring device then uses light reflected from the wafer film being measured to determine the film's thickness.

The polishing apparatus of the present invention preferably synchronizes the film-thickness measuring device with movements of the wafer being polished. Such synchrony of movement allows the film thickness to be measured at the same position (i.e., at a fixed-point) on the wafer, even if the wafer being polished moves in predictable or unpredictable amounts and directions during polishing.

The polishing apparatus preferably includes a polishing body having a rotatable polishing wheel (preferably comprising glass) and a polishing pad. The polishing wheel and the polishing pad are preferably made of light-permeable materials.

Alternatively, the polishing body may be a belt that moves in a linear direction. The wafer to be polished is placed against the belt such that the wafer and the belt move against one another. Preferably, the belt comprises a light-permeable material.

A photodetector may be included in the polishing apparatus of the present invention such that the wafer being polished may be observed during polishing. The photodetector is preferably positioned opposite the wafer surface being polished. The photodetector is preferably controlled to move in synchrony with the wafer as the wafer is polished. In this manner, the film thickness of the wafer being polished is always measured at the same position on the wafer.

Using information obtained from the photodetector, the position of the wafer film being measured is detected so that the film-thickness measuring device may be moved with the object being polished so that the film-thickness measuring device always measures from the same position.

In a preferred embodiment of the present invention, the light-permeable material of the polishing pad is preferably a synthetic resin comprising the reaction product of an epoxy resin, an amine, such as tetraethylenepentamine, and graphite, or other suitable material as a hardener.

DETAILED DESCRIPTION OF THE INVENTION

Figure 1:
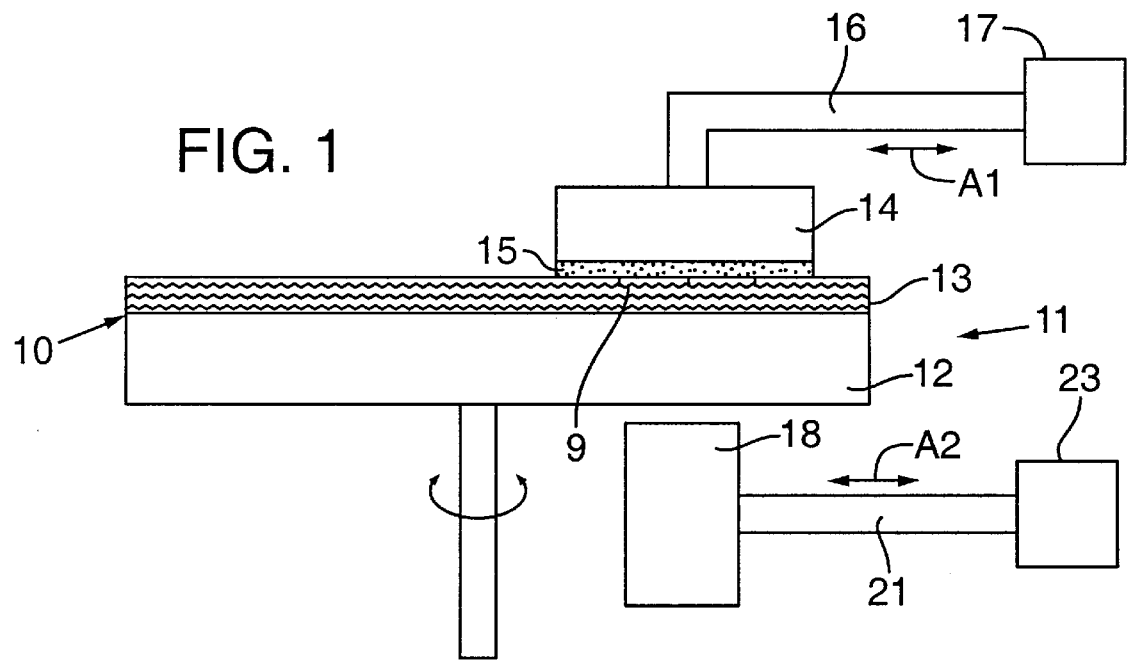
FIG. 1 is a side elevational view of a polishing apparatus according to a first embodiment of the present invention.

FIG. 1 shows a first embodiment of a polishing apparatus 11 of the present invention. The polishing apparatus 11 (for polishing a semiconductor wafer or other workpiece) preferably comprises a polishing agent (not shown) placed between a polishing body 10 and a wafer 15 to be polished. The polishing apparatus further comprises a film-thickness measuring device 19 (FIG. 2) for measuring the thickness of a film on the wafer surface 9 and a photodetector 20 (e.g., an infrared photodetector) for determining the position on the wafer where the film thickness is measured during the polishing process.

More specifically, a first embodiment of the polishing apparatus 11 of the present invention preferably comprises a polishing body 10 comprising a polishing pad 13 placed on a rotatable polishing wheel 12. The wafer 15 to be polished is held by a wafer holder 14. The wafer holder 14 is supported by a first support arm 16 that is, in turn, connected to a first drive device 17. The wafer holder 14 is both rotatable and translatable by the first drive device 17. That is, the wafer holder 14 (hence, wafer 15) may be rotated and, simultaneously, translated by the first drive device 17. Accordingly, the wafer holder 14 rotates and, simultaneously moves along the polishing pad 13 in the directions indicated by the arrow A1 in FIG. 1.

Preferably, the polishing apparatus 11 includes a polishing agent outlet (not shown) for placing the polishing agent (not shown) onto the polishing pad 13 during the polish process.

Figure 5:
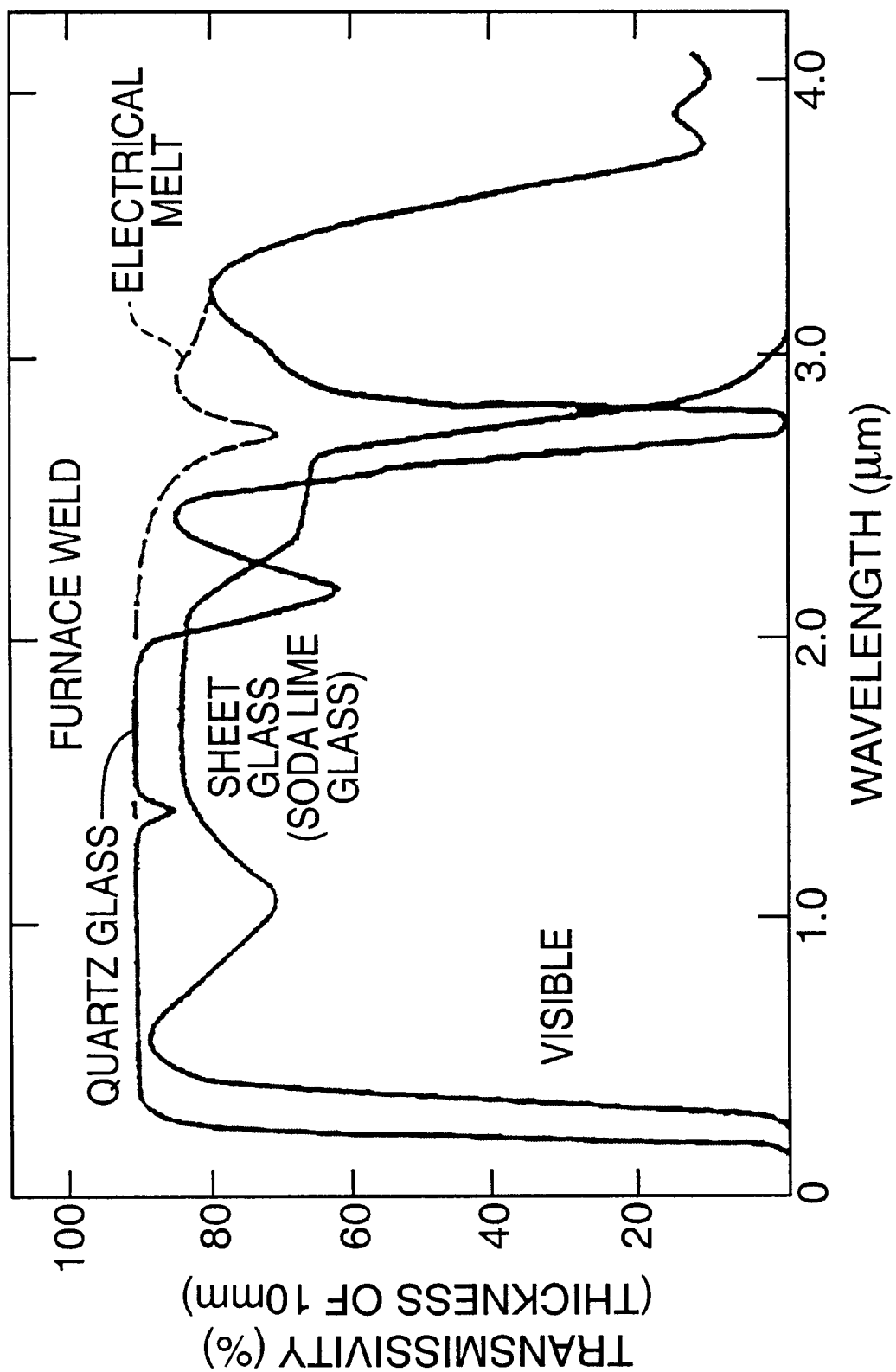
FIG. 5 is a graph showing the transmissivity of glass at particular wavelengths.

The polishing wheel 12 preferably comprises a light-permeable material, such as a silicon material, capable of transmitting infrared light. Alternatively, when the transmission wavelength band is to be from about 1 $\mu$m to about 2.6 $\mu$m, quartz glass is preferable over silicon as the material of the polishing wheel 12. As shown in FIG. 5, the transmissivity of quartz glass material at a wavelength band of about 1 $\mu$m to about 2.6 $\mu$m is good. Accordingly, a polishing wheel 12 comprising quartz glass, when used with a light source generating light having a wavelength band of about 1 $\mu$m to about 2.6 $\mu$m, provides superior precision in the measurement of a wafer-film thickness.

The polishing pad 13 also comprises a light-permeable material, preferably a synthetic resin. A preferred embodiment of the polishing pad 13 comprises the reaction product of an epoxy resin, an amine (preferably tetraethylenepentamine), and graphite (or other suitable material capable of acting as a hardening agent for the resin compound). To make the reaction product, the epoxy resin, amine, and graphite are preferably mixed together in a ratio of about 3 to about 7:1:1/150, by weight. The graphite or other hardening material is added in an amount sufficient to achieve suitable hardness of the reaction product. The resulting hardness of the polishing pad may be adjusted by altering constituent amounts in the mixture or altering the cure process, as described below.

To form the polishing pad 13, a melted resin mixture comprising a combination of an epoxy resin, an amine (such as tetraethylenepentamine), and graphite is, preferably, applied to the polishing wheel 12 as a layer having a prescribed depth. A compression tool (not shown, but coated with a separation agent) is pressed onto the resin mixture applied to the polishing wheel 12. The applied resin mixture is adjusted to a desired thickness by adjusting the pressure of the compression tool on the polishing wheel 12. That is, the pressure applied by the compression tool may be varied to change the thickness of the resultant polishing pad 13 formed after the resin mixture is cured.

The compression tool (not shown), the polishing wheel 12, and the compressed resin mixture are then placed in a constant-temperature environment. The resin mixture remains in the constant-temperature environment until the resin mixture is cured (i.e., hardened). The temperature level and curing time periods suitable to cure the resin mixture depend upon the mass ratios of the ingredients of the mixture and the desired hardness. These parameters are readily apparent to those persons skilled in the art. The hardness of the polishing pad 13 material is, preferably about 60 to about 130 on the Asker-C scale and is, preferably, matched to the hardness of the film on the wafer surface 9 to be polished.

After the resin compound is cured the resulting polishing pad 13 is removed from the compression tool. Grooves (not shown) are then cut into a polishing surface of the polishing pad 13. The grooves allow passage of a polishing agent (not shown) during the polish process.

Because the epoxy resin of the polishing pad 13 has adhesive characteristics, the polishing pad 13 becomes fused directly to the polishing wheel 12 and additional adhesives are not necessary.

Figure 3:
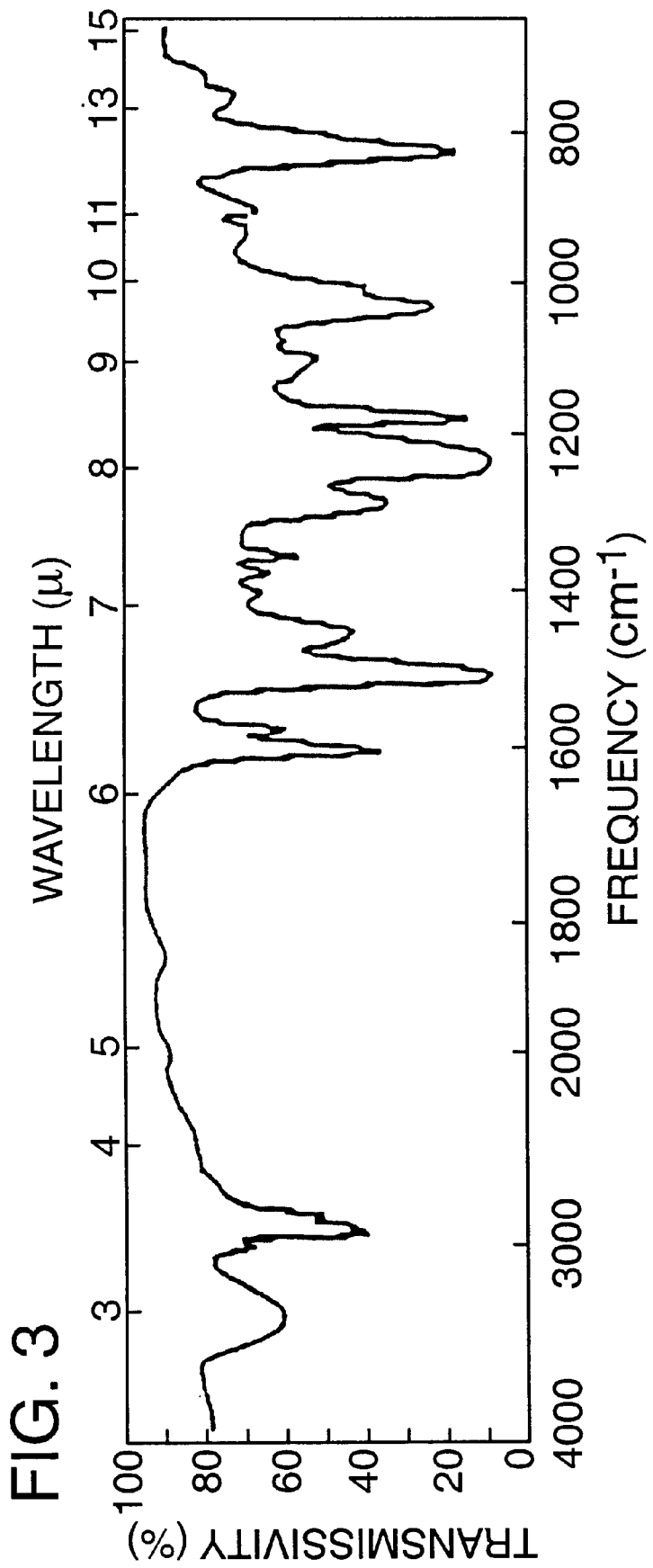
FIG. 3 is a graph showing the transmissivity, at particular wavelengths, of an embodiment of a polishing pad according to the first embodiment of the present invention.

The transmissivity of the polishing pad 13 at various wavelengths is shown in FIG. 3. Referring to FIG. 3, it is apparent that infrared light having a wavelength about 4 μm to about 6 μm is readily transmitted through the polishing pad 13 having the same or a similar composition as that discussed above.

An endpoint-detection device 18 is preferably positioned on the opposite side of the polishing wheel 12 relative to the wafer 15. The endpoint-detection device 18 is held in place by a second support arm 21. The second support arm 21 is, in turn, connected to a second drive device 23. The endpoint-detection device 18 is both rotatable and translatable by the second drive device 23. That is, the endpoint-detection device 18 may be rotated and simultaneously moved parallel to the surface 9 of the wafer 15 in the directions shown by arrow A2 in FIG. 1. The first and second drive devices 17, 23 are, preferably, controlled such that the endpoint-detection device 18 is rotated and/or translated in synchrony with the movements of the wafer holder 14.

The endpoint-detection device 18 preferably comprises a film-thickness measuring device 19, a photodetector 20, a light source, preferably an infrared-light source 22, and an image-pickup light source 25. The film-thickness measuring device 19 measures the thickness of a polished film on the wafer surface 9. The photodetector 20 detects light reflected by the wafer surface 9, allowing observation of the state-of-polish of the wafer surface 9 during the polish process. The film-thickness measuring device 19 and the photodetector 20 are arranged so that measurements and observations are made using infrared light that passes through the polishing wheel 12 and the polishing pad 13.

The film-thickness measuring device 19 preferably comprises a spectral ellipsometer that analyzes polarized light reflected from the wafer surface 9. Alternatively, the film-thickness measuring device 19 may comprise an interferometer.

Figure 2:
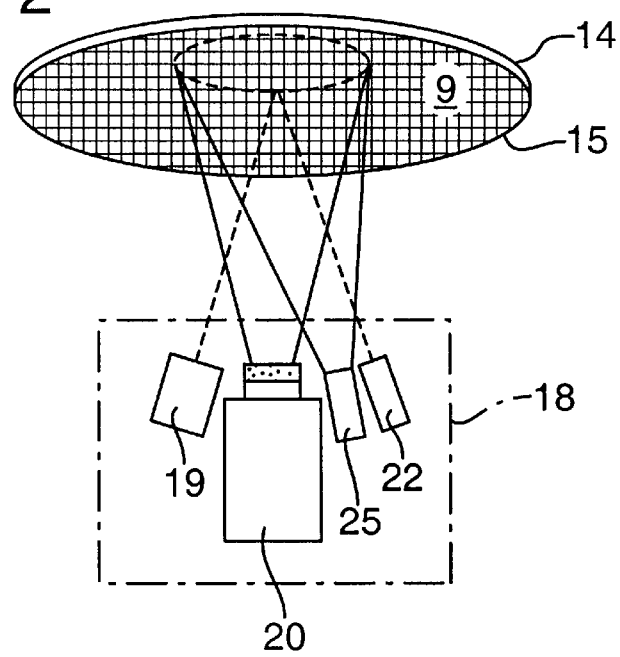
FIG. 2 is a plan view showing select features of the polishing apparatus shown in FIG. 1.

Referring to FIG. 2, infrared light from the image-pickup light source 25 is projected through the polishing wheel 12 and the polishing pad 13 (not shown in FIG. 2, but see FIG. 1), and onto the wafer surface 9. Infrared light reflected from the surface 9 of the wafer 15 is then incident upon the photodetector 20.

Figure 4:
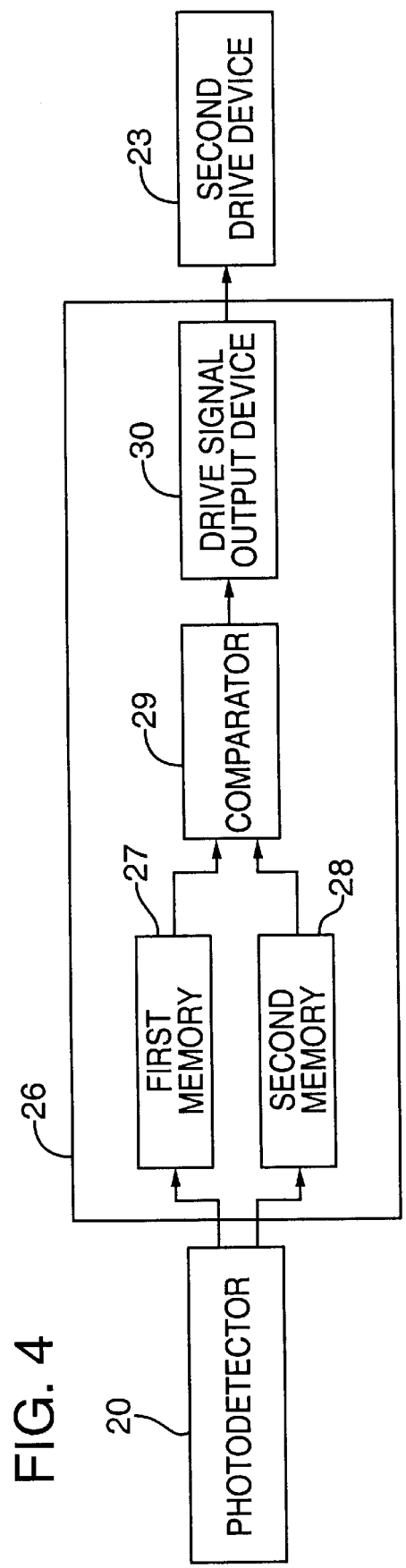
FIG. 4 is a block diagram showing an infrared photodetector, a regulator, and a drive device of the first embodiment of the present invention.

As shown in FIG. 4, the photodetector 20 is connected to the second drive device 23 by means of a regulator 26. This configuration allows determination of the position on the wafer where the film thickness measurement is made. The film-thickness measuring device 19 and the wafer 15 are then moved synchronously such that the film thickness on the wafer surface 9 is always measured at the same position on the wafer 15, even though the wafer 15 is moving.

More specifically, referring further to FIG. 4, the regulator 26 comprises a first memory 27 and a second memory 28 that are connected to the photodetector 20. The initial data on light reflected from the wafer surface, as detected by the photodetector 20, and the position on the wafer where the film thickness is measured, are input into the first memory 27 before the polish process begins. Subsequent data on light reflected from the wafer surface, obtained by the photodetector 20 during the polish process, is input into the second memory 28.

Both the first memory 27 and the second memory 28 are connected to a comparator 29. The comparator 29 compares the reflected light data from the first memory 27 (i.e., data corresponding to an unpolished wafer surface, used as a standard) with the reflected light data obtained during the polish process in order to determine the amount and direction that the film thickness measuring position may have drifted due to movements, such as drift of the wafer 15 in the wafer holder 14. The data corresponding to the measuring position drift is then input into a drive-signal output device 30. The output device 30 provides signals to control the second drive device 23, changing the position of the endpoint-detection device 18 such that the film-thickness measurement always occurs at the same position on the wafer surface 9.

During operation of the polishing apparatus according to the first embodiment, the wafer 15 is held in the wafer holder 14 and is placed in contact with the exposed surface of the polishing pad 13 (FIG. 1). While pressure is applied to the wafer holder 14, the first drive device 17 rotates the holder 14 (and hence the wafer 15) and, simultaneously, moves the wafer holder in a horizontal direction (as shown by the arrow A1 in FIG. 1). Coincident with this action, a polishing agent nozzle (not shown) dispenses polishing agent (not shown) on the polishing pad 13 to polish the surface 9 of the wafer 15. At this point, the first drive device 17 and the second drive device 23 move the wafer holder 14 (hence, the wafer 15) and the endpoint-detection device 18, respectively, in synchrony such that both are rotated and translated with matched speeds and displacements relative to the wafer. The thickness of the wafer surface film being polished is constantly measured by the film-thickness measuring device 19 at the same position on the wafer 15.

The photodetector 20 detects the infrared light reflected from the surface 9 of the wafer 15, even if the wafer 15 drifts within the wafer holder 14. That is, the photodetector 20 detects and determines the amount and direction of drift, and the second drive device 23 moves the endpoint detection device 18 to accommodate for such drift. Accordingly, the same position on the wafer surface 9 is measured regardless of the amount and/or direction of drift.

More specifically, data encoded in reflected light detected by the photodetector 20 during the polish process are input into the second memory 28 device. Signals corresponding to the detected reflected light data from the second memory 28 and signals corresponding to the standard reflected light data previously input to the first memory device 27 are compared by the comparator 29. The amount and direction of the drift from the initial film-thickness measurement position is determined. The drift values are input to the drive-signal output device 30. The output device 30 regulates the second drive device 23. The endpoint-detection device 18 is rotated and translated in an amount and in appropriate directions to accommodate the drift.

To measure the actual film thickness, infrared light is emitted from an infrared-light source 22 and transmitted through the polishing wheel 12 and the polishing pad 13 to illuminate the wafer surface 9. The light reflected from the wafer surface 9 is incident on the film-thickness measuring device 19. Based on the amount of reflected light detected, the film-thickness measuring device 19 determines the thickness of the film on the surface 9 of the wafer 15. Physical property characteristics, such as the index of refraction of both the polishing wheel 12 and the polishing pad 13, and reflection of infrared irradiation and absorption of infrared irradiation by both the polishing wheel 12 and the polishing pad 13, are variables that are considered when determining the actual film thickness. By continually measuring the film thickness during the polish procedure, the polishing endpoint is determined.

In general, a solid object radiates infrared rays according to its temperature. The surface 9 of the wafer 15 radiates infrared rays according to its local temperature. The infrared rays emitted from the surface 9 of the wafer 15 are transmitted through the polishing pad 13 and the polishing wheel 12 to be incident upon the photodetector 20. Thus, a thermal image of the surface 9 of the wafer 15 is observed. It is not necessary to provide a special light source for such observation.

In this way, since the polishing wheel 12 and the polishing pad 13 comprise materials permeable to infrared light such that film thickness measurements may be made, unlike the conventional methods, it is unnecessary for the polishing pad 13 to have openings therethrough. As a result, a more uniform polished wafer surface is realized than is achievable using conventional methods and apparatus.

Also, because the wafer holder 14 and wafer 15 are moved synchronously with the endpoint-detection device 18, the film thickness is always measured at the same position on the wafer 15 during the polish process. Moreover, because the polishing apparatus of the present invention corrects for any drift of the wafer 15 in the wafer holder 14, a more accurate and consistent measurement of film thickness is determined.

Furthermore, the resin materials comprising the polishing pad 13 provide the necessary hardness and viscoelasticity for polish processes of relatively long duration. For this reason, the polishing apparatus of the present invention may be used under high-speed, high-pressure polishing conditions to produce a high-precision polished wafer surface 9 with superior uniformity even during lengthy polishing.

Additionally, the epoxy resin polishing pad 13 of the present invention "hardens" (i.e., cure) with very little shrinkage, releases easily from a curing mold, has excellent resistance to mechanical wear and chemical deterioration, and provides superior sculptability.

Figure 6:
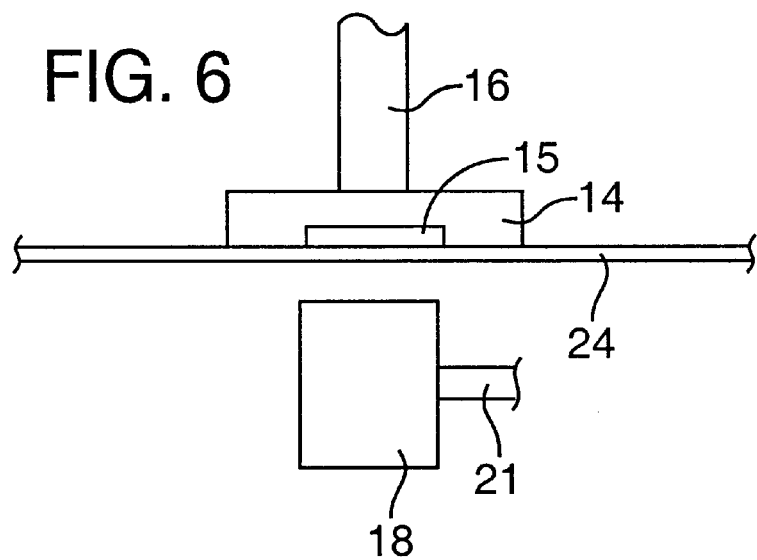
FIG. 6 is a sectional side elevational view of a polishing apparatus according to a second embodiment of the present invention.
Figure 7:
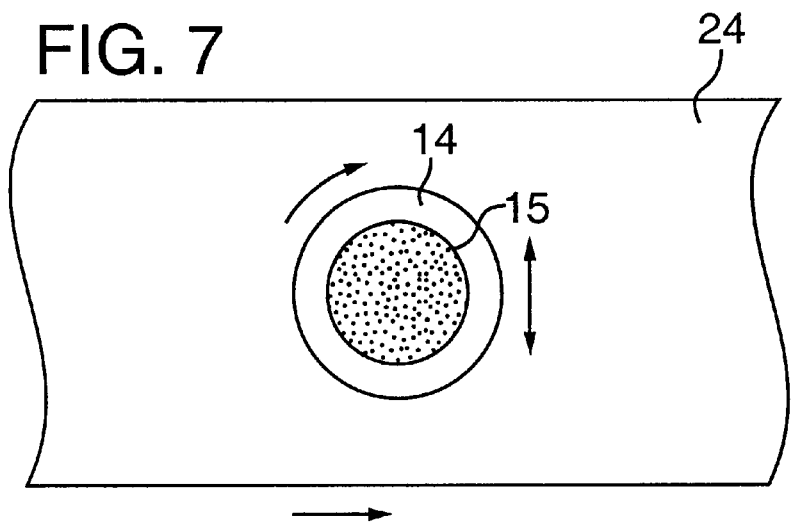
FIG. 7 is a sectional plan view of a polishing apparatus according to a second embodiment.
Figure 8:
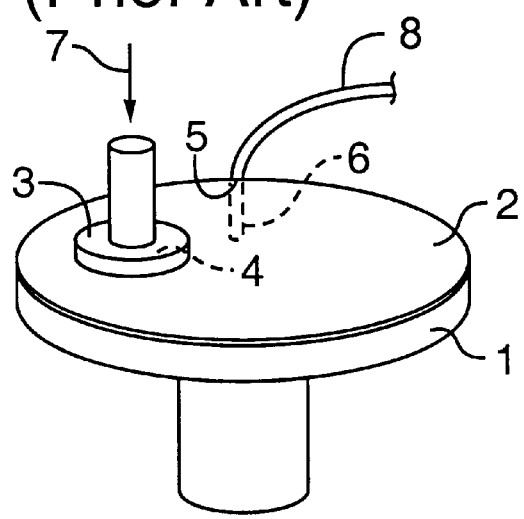
FIG. 8 is a perspective view of a conventional polishing apparatus.

FIGS. 6 and 7 show a second embodiment of the polishing apparatus of the present invention. For simplicity, features in the second embodiment that are identical to those features in the first embodiment have the same reference numerals. In the first embodiment, a polishing body 10 included a rotatable polishing wheel 12 and a polishing pad 13 connected thereto. In the second embodiment, a belt 24 takes the place of the polishing body 10 of the first embodiment. The belt 24 is translatable. The belt 24 is preferably comprised of a light-permeable material. As in the first embodiment, the second embodiment provides synchrony of movement of the wafer 15 and the endpoint-detection device 18.

By irradiating the belt 24 with infrared light (which is transmitted by the belt 24), the film thickness of the wafer surface 9 is measured during the polish process. As with the first embodiment, there is no need to provide openings in the belt 24. Because the endpoint-detection device 18 and the wafer 15 are moved in synchrony, a film thickness measurement always takes place at the same position on the wafer during the polish process.

For both the first and second embodiments, the film thickness measurements may be carried out using light other than infrared light. If so, the polishing wheel 12 and polishing pad 13 of the first embodiment, and the belt 24 of the second embodiment, are comprised of materials that transmit the selected type of light.

In the first and second embodiments of the present invention, by using first and second drive devices 17, 23, the wafer 15 and the endpoint-detection device 18 are moved synchronously. Alternatively, the wafer 15 and the endpoint detection device 18 could be driven synchronously using a single drive device.

Having illustrated and described the principles of the invention with multiple embodiments, it should be apparent to those skilled in the art that the invention can be modified in arrangement and detail without departing from such principles. We claim all the modifications coming within the spirit and scope of the following claims.

I claim:

1. A polishing apparatus for polishing the surface of a wafer, comprising:

(a) a polishing body comprising a light-permeable material, the polishing body having a first side and a second side, the first side of the polishing body being for pressing against and polishing a surface of a wafer;

(b) a wafer holder for holding the wafer, the wafer holder being positioned on the first side of the polishing body;

(c) a light source positioned on the second side of the polishing body for emitting light to be transmitted through the polishing body and onto the surface of the wafer;

(d) a film-thickness measuring device positioned on the second side of the polishing body to detect light emitted by the light source, reflected by the surface of the wafer, and transmitted through the polishing body, to determine the thickness of a wafer-surface film being polished; and (e) a drive device for moving the wafer holder and the film-thickness measuring device in synchrony with each other so that the thickness measurement of the wafer-surface film is always performed at the same position on the wafer, independently of any movement of the wafer.

2. The apparatus of claim 1, further comprising a dispenser operable to apply a polishing agent between the polishing body and the wafer during polishing.

3. The apparatus of claim 1, wherein the polishing body comprises a polishing wheel and a polishing pad fixed to a surface of the polishing wheel, wherein the polishing wheel and the polishing pad comprise light-permeable materials.

4. The apparatus of claim 3, wherein the polishing wheel is rotatable.

5. The apparatus of claim 3, wherein the light source emits infrared radiation.

6. The apparatus of claim 5, wherein the polishing pad comprises a resin compound.

7. The apparatus of claim 6, wherein the resin compound is a reaction product of an epoxy resin, an amine, and graphite.

8. The apparatus of claim 7, wherein the infrared radiation has a wavelength of about 4 $\mu$m to about 6 $\mu$m.

9. The apparatus of claim 5, wherein the polishing wheel comprises a glass.

10. The apparatus of claim 9, wherein the infrared radiation has a wavelength of about 1 $\mu$m to about 2.6 $\mu$m.

11. The apparatus of claim 1, wherein the drive device rotates and translates the wafer holder.

12. The apparatus of claim 11, wherein the drive device rotates and translates the film-thickness measuring device in synchrony with the rotation and translation movements of the wafer holder.

13. The apparatus of claim 12, wherein the drive device comprises a first drive device that rotates and translates the wafer holder and a second drive device that rotates and translates the film-thickness measuring device.

14. The apparatus of claim 13, wherein the drive device rotates and translates the photodetector in synchrony with the rotation and translation movements of the wafer holder.

15. The apparatus of claim 1, wherein the polishing body comprises a belt, the belt comprising a light-permeable material for pressing against and polishing the surface of the wafer.

16. The apparatus of claim 1, further comprising a photodetector positioned on the second side of the polishing body for detecting light reflected by the surface of the wafer to provide for observation of the state-of-polish of the wafer surface.

17. The apparatus of claim 16, wherein the photodetector utilizes data corresponding to the detected light reflected by the surface of the wafer to determine the position on the wafer upon which the film-thickness measuring device is measuring the film thickness.

18. The apparatus of claim 17, further comprising a regulator, wherein the photodetector generates and sends data signals that correspond to the position on the wafer at which the film thickness is being measured, to the regulator.

19. The apparatus of claim 18, wherein the regulator processes the data signals received from the photodetector for use in controlling the drive device to rotate and translate the film-thickness measuring device and photodetector such that the film-thickness measurement occurs at the same position on the wafer.

20. A polishing apparatus for polishing the surface of a wafer, comprising:
   (a) a polishing body comprising a light-permeable material, the polishing body having a first side and a second side, the first side of the polishing body being for pressing against and polishing a surface of a wafer;
   (b) a wafer holder for holding the wafer on the first side of the polishing body;
   (c) a light source positioned on the second side of the polishing body for emitting light to be transmitted through the polishing body and onto the surface of the wafer;
   (d) an endpoint-detection device positioned on the second side of the polishing body for detecting light reflected by the surface of the wafer and using data corresponding to the detected light to determine the position on the wafer upon which the light is reflected; and
   (e) a drive device for moving the wafer holder and the endpoint-detection device in synchrony with each other so that the light is always emitted onto the same position on the surface of the wafer, independent of any movement of the wafer.

21. The apparatus of claim 20, wherein the endpoint-detection device further comprises a film-thickness measuring device to detect light that is reflected by the surface of the wafer and transmitted through the polishing body, to determine the thickness of a film on the surface of the wafer.

22. A method of polishing a wafer, comprising the steps of:
   (a) providing a light-permeable polishing body having a first side for polishing a surface of a wafer;
   (b) rotating and translating the wafer while pressing the surface of the wafer against the first side of the polishing body;
   (b) emitting light from a light source positioned on a second side of the polishing body such that the light is transmitted through the polishing body and onto the surface of the wafer;
   (c) detecting light reflected by the surface of the wafer to determine the position on the wafer upon which the light is being reflected; and
   (d) measuring a characteristic of the light reflected by the surface of the wafer sufficient for determining from the measured characteristic the thickness of a film on the surface of the wafer.

23. The method of claim 22, wherein reflected light is detected in step (c) using a photodetector and the characteristic is measured in step (d) using a film-thickness measuring device, wherein the photodetector, the light source, and the film-thickness measuring device are rotated and translated in synchrony with the rotation and translation of the wafer such that light is always emitted onto the same position of the surface of the wafer.

24. The method of claim 23, further comprising the steps of:
   before beginning polishing of the wafer, emitting light from the light source through the polishing body and onto the surface of the wafer and detecting light reflected by the surface of the wafer with a photodetector to determine a first position on the wafer upon which the light is being reflected;
   storing data corresponding to the first position on the wafer in a first memory;
   while polishing the wafer, emitting light from the light source through the polishing body and onto the surface of the wafer and detecting light reflected by the surface of the wafer with the photodetector to determine a second position on the wafer upon which the light is being reflected while the wafer is being polished;
   storing data corresponding to the second position on the wafer in a second memory;
   comparing the data corresponding to the first position with the data corresponding to the second position to determine a difference in the first position and the second position; and
   rotating and translating the photodetector and light source an amount and in directions corresponding to the difference in the first position and the second position such that light is always emitted from the light source on the same position on the surface of the wafer during polishing of the wafer.

* * * * *